United States Patent [19]

Thornber

[11] 4,331,935

[45] May 25, 1982

[54] TUNING APPARATUS FOR A RADIO FREQUENCY POWER DEVICE

[75] Inventor: Geoffrey Thornber, Aptos, Calif.

[73] Assignee: Brunswick Corporation, Skokie, Ill.

[21] Appl. No.: 66,226

[22] Filed: Aug. 13, 1979

[51] Int. Cl.[3] .......................... H01J 25/50; H03B 9/10

[52] U.S. Cl. .................................... 331/90; 315/39.59; 315/39.61

[58] Field of Search .............................. 331/86, 90, 96; 315/39.55, 39.59, 39.61

[56] References Cited

U.S. PATENT DOCUMENTS

| | | | |
|---|---|---|---|
| 2,589,885 | 3/1952 | Sonkin | 315/39.59 |
| 2,814,761 | 11/1957 | Derby et al. | 315/39.59 |
| 2,953,753 | 9/1960 | La Rue | 331/90 |
| 3,014,152 | 12/1961 | Shelton, Jr. | 315/39.61 |
| 3,154,717 | 10/1964 | Boyd et al. | 315/39.61 |
| 3,187,220 | 6/1965 | Dench | 331/90 |
| 3,262,009 | 7/1966 | Sibley | 315/39.61 |
| 3,599,035 | 8/1971 | Frerichs et al. | 315/39.59 |

*Primary Examiner*—Siegried H. Grimm

*Assistant Examiner*—Edward P. Westin

*Attorney, Agent, or Firm*—George J. Porter

[57] ABSTRACT

A tuning assembly is disclosed for selectively oscillating the frequency of an electromagnetic field within a hermetically sealed device, which device includes a rigid, hermetically sealed housing, apparatus for generating the electromagnetic field therewithin, and elements for defining a cavity within the housing for establishing the frequency of the electromagnetic field. The tuning assembly includes electrically conductive members mounted for linear movement within the cavity to selectively vary the volume of the cavity to oscillate the established frequency. Elements disposed within the rigid housing are provided for mounting the electrically conductive members, and are adapted for oscillatory movement at a pre-determined mechanical resonant frequency to move the electrically conductive members in the described linear manner. Finally, a power source is provided exterior to the rigid housing and is magnetically coupled to the mounting elements for exciting the mounting elements.

4 Claims, 10 Drawing Figures

TUNING APPARATUS FOR A RADIO FREQUENCY POWER DEVICE

BACKGROUND OF THE INVENTION

1. Field of the Invention

This invention relates generally to radio frequency power devices and more particularly to tuning assemblies for oscillating the frequency output of such devices. More specifically, the subject invention relates to a novel tuning assembly for oscillating the frequency of an electromagnetic field generated within a hermetically sealed device, and in particular within a magnetron tube, to thereby oscillate the frequency output of such device.

2. Description of the Prior Art

Radio frequency power devices are well known in the art. Such power devices may generate radio frequency outputs at a fixed frequency or at variable frequencies oscillating within a specified operating frequency band. In general, such radio frequency power devices include therewithin a hermetically sealed housing which is either evacuated, as in the case of a vacuum tube or a magnetron, or is filled with an inert gas. A variety of well known systems are utilized to generate an electromagnetic field within the hermetic housing, with the current induced from such an electromagnetic field being directed to an output antenna.

One commonly used arrangement for generating such an electromagnetic field includes positioning an anode ring about a centrally disposed cathode within the hermetic housing, and then establishing a magnetic field around the anode. This is commonly done by positioning a pair of magnets on either side of the anode. In this manner, an electrical field is created between the cathode and anode, and a magnetic field is generated within the interaction space between the cathode and anode, thereby establishing an electromagnetic field at the anode. In this particular arrangement, the anode ring defines a cavity space radially inwardly thereof wherein the frequency of the electromagnetic field is established. In other arrangements, such as in a coaxial magnetron tube, the cavity space wherein the frequency of the electromagnetic field is defined may be located exterior to the anode.

In the above described arrangement, the frequency of the electromagnetic field is defined by the physical size and shape of the cavity as well as the conductive properties of the material utilized to form the cavity. One known cavity arrangement includes a plurality of tabs or vanes projecting radially inwardly from the inner surface of the anode ring, and the frequency of the electromagnetic field is determined by the conductive properties of the vanes, the size of the vanes, the spacing between the vanes, and the manner in which the vanes may be electrically interconnected at their radially inner edges. Thus, by adjusting these variables of the vane structure and thereby changing the overall volume of the cavity, any desired frequency may be preselected prior to construction of the radio frequency device. The manner in which the vane structure is constructed and altered so as to establish a desired fixed frequency is well known in the art and will not be discussed in any detail herein.

Once the shape and the volume of the frequency determining cavity is established, the frequency of the electromagnetic field generated within such a device is set, and the resultant frequency output of the device becomes fixed. In variable frequency power devices, however, the frequency of the electromagnetic field within the hermetic housing is tunable or varied in an oscillating manner by changing the volume of the frequency determining cavity in an oscillatory fashion, thereby changing the inductive properties thereof. One known technique for changing the volume of the frequency determining cavity includes positioning an electrically conductive member within the cavity and oscillating that member therewithin, thereby varying the volume of the cavity in an oscillatory manner. To achieve such oscillatory motion of an electrically conductive member within the cavity, prior devices have commonly utilized mechanical arrangements for moving the electrically conductive member.

One such mechanical tuning arrangement utilizes a thin wall bellows or diaphragm as part of the hermetic housing. The electrically conductive members are then mechanically connected to such a bellows or diaphragm, and the bellows or diaphragm are mechanically oscillated by a motor located outside the hermetic housing.

Another known tuning arrangement for changing the volume of the frequency determining cavity includes positioning electrically conductive members within the cavity and rotating such members along the inner surface of the anode ring. Such rotation is effected by magnetically coupling the rotating electrically conductive member to an electromagnetic power source disposed outside the housing. A distinct disadvantage to this latter technique, however, is that by rotating an electrically conductive member within the frequency determining cavity, the electromagnetic field frequency can be varied, but not in an oscillatory manner.

The movable bellows or diaphram arrangement described above, however, also has certain disadvantages. One major disadvantage with this mechanical tuning arrangement is that the walls of the bellows or diaphragm must be relatively thin to effect such movement and are thereby subject to mechanical fatigue and failure. If such a bellows or diaphragm does fail, the vacuum or inert gas environment within the hermetic housing is destroyed, and the power source thereby becomes useless. Another disadvantage is that since the bellows or diaphragm must be constructed from a thin walled material, atmospheric gas can penetrate such thin material over a period of time and can thereby affect the internal environment. Therefore, such mechanical arrangements have a relatively short storage or shelf life.

A further disadvantage of the above mechanical tuning assemblies is that a significant energy input is required to operate such assemblies. This requirement is due to the mechanical resistance offered by the bellows or diaphragm arrangement as well as to the atmospheric dampening effect on the mechanical parts located exterior to the hermetic housing or envelope.

The novel tuning assembly of the present invention, however, overcomes the disadvantages of known mechanical tuning assemblies, and provides a relatively simple yet efficient means for oscillating the frequency of the electromagnetic field generated within such radio frequency power sources.

SUMMARY OF THE INVENTION

Therefore, it is one object of the present invention to provide a tuning assembly for selectively oscillating the frequency output of a radio frequency power source.

It is another object of the present invention to provide a tuning assembly for selectively oscillating the frequency of an electromagnetic field within a hermetically sealed device wherein the device has a rigid or hermetic housing.

A further object of the present invention is to provide a magnetron tube having an oscillating frequency output and a rigid, hermetically sealed housing.

It is yet another object of the present invention to provide a tunable magnetron tube wherein the mechanical components of the tuner assembly are located entirely within a rigid, inflexible hermetic housing.

In accordance with the invention, a tuning assembly is provided for selectively oscillating the frequency of an electromagnetic field within a hermetically sealed device wherein such device includes a rigid, hermetically sealed housing, a mechanism for generating an electromagnetic field within the housing, and elements for defining a cavity within the housing for establishing the frequency of the electromagnetic field. The novel tuning assembly includes electrically conductive members mounted for linear movement within the frequency defining cavity to selectively vary the volume of the cavity to oscillate the established frequency of the electromagnetic field. A mounting assembly for mounting the electrically conductive members is disposed within the rigid housing and is adapted for oscillatory movement at a pre-determined mechanical resonant frequency to move the electrically conductive members in the aforementioned linear manner. Finally, a power source is located exterior to the rigid housing and is magnetically coupled to the mounting assembly for exciting the mounting assembly.

The tuning assembly of the present invention may be adapted to oscillate the electromagnetic field frequency within any hermetically sealed device having a rigid, hermetically sealed housing and a frequency defining cavity within such housing. The subject invention, however, is particularly useful in radio frequency power sources such as variable frequency magnetron tubes.

In one preferred embodiment of the present invention, the mounting mechanism includes a support member for securely mounting the electrically conductive members within the housing. A spring mechanism is provided for interconnecting the support member and the housing and is adapted to permit oscillatory movement of the support member within the housing. The pre-selected mechanical resonant frequency of the mounting mechanism is directly determinable in accordance with known techniques from the mass of the electrically conductive members and the mounting mechanism as well as the spring rate of the spring mechanism. The support member is maintained at a constant pre-determined oscillatory movement by pulsing the power source at the same frequency as the pre-selected mechanical resonant frequency of the mounting mechanism. In this manner, the frequency of the electromagnetic field, and thereby the output frequency of the device, may be selectively oscillated in accordance with the pre-selected mechanical resonant frequency of the tuning assembly.

BRIEF DESCRIPTION OF THE DRAWINGS

The novel features which are believed to be characteristic of the present invention are set forth in the appended claims. The invention itself, however, together with further objects and attendant advantages thereof will become apparent and best understood by reference to the following detailed description taken in connection with the accompanying drawings, setting forth by way of illustration and example certain embodiments of the invention in the several figures of which like reference numerals identify like elements, and in which:

DETAILED DESCRIPTION OF THE PREFERRED EMBODIMENTS

Figure 1:
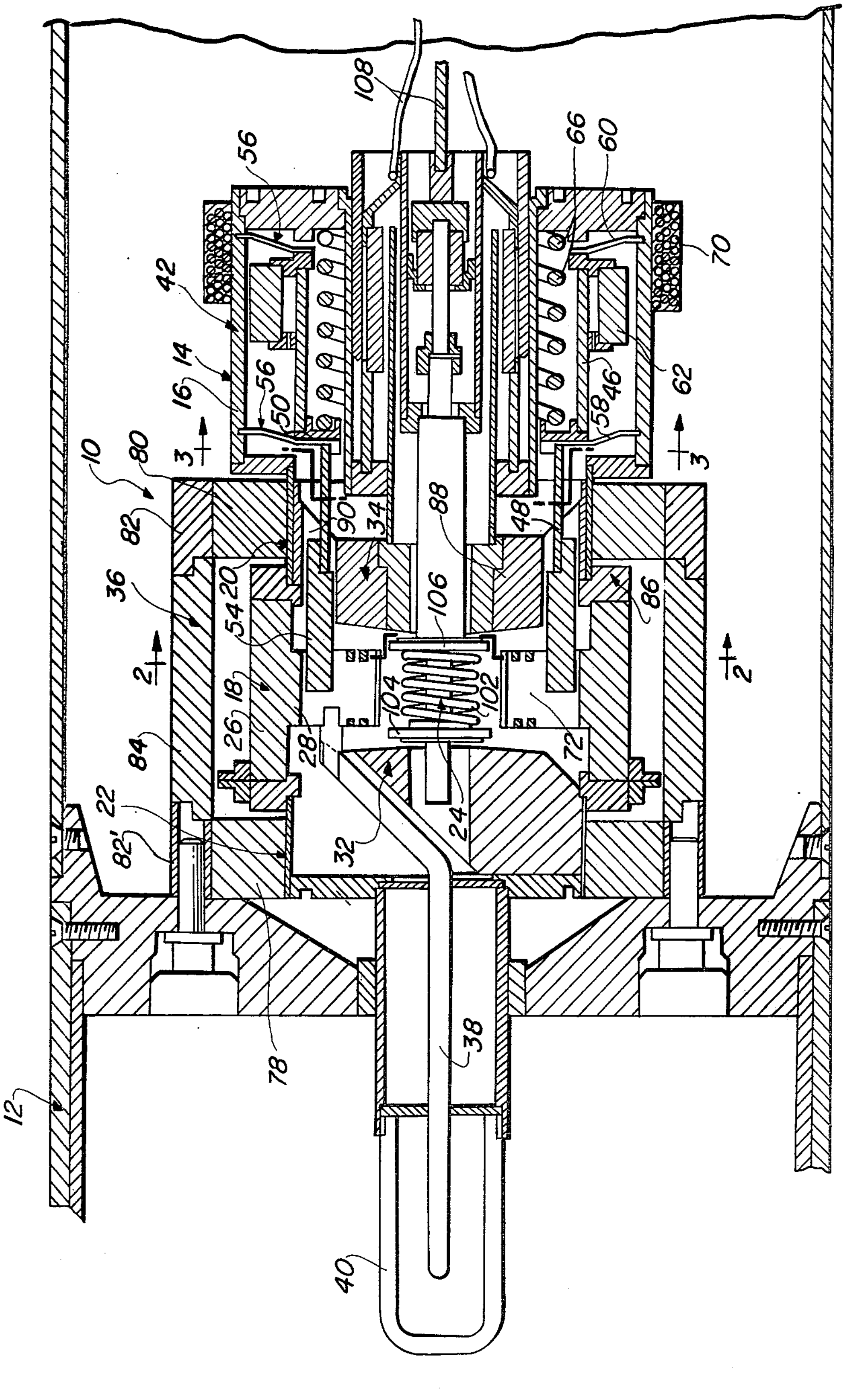
FIG. 1 is a side-sectional view of a magnetron tube mounted within a device, illustrating one embodiment of the tuning assembly of the present invention.

Referring to FIG. 1, a hermetically sealed device such as a magnetron tube 10 is illustrated and incorporates the tuning assembly of the present invention. Radio frequency power sources such as the magnetron tube 10 have many different uses, FIG. 1 illustrating the tube 10 mounted in a radar decoy missile system 12. It is to be understood, however, that the present invention is not to be limited for use in such a magnetron tube 10, but rather may be utilized in any device wherein the device includes a rigid hermetic housing and requires selective oscillation of an electromagnetic field generated within the housing.

The illustrated magnetron tube 10 includes a hermetically sealed housing 14 having an evacuated internal atmosphere. The housing 14 is entirely rigid and is comprised of a tuner assembly housing 16, an anode assembly 18, and two magnetic pole piece housings 20 and 22 disposed on either side of the anode 18. These members 16–22 are all heliarc welded together to form the hermetically sealed housing 14.

Disposed within the housing 14 is the anode assembly 18, which forms a part of the housing 14, and a cathode assembly 24 spaced from the anode 18. In preferred form, the cathode 24 is centrally disposed along the longitudinal axis of the housing 14, which in preferred form is annular in shape. The anode 18 preferably is in the form of an annular ring 26 having an inner raised rim portion 28 projecting radially inwardly toward the cathode 24 from the center portion of the ring 26. The inner surface of the ring 26 defines generally a cavity area 30 (FIG. 2) which is disposed between the anode 18 and the cathode 24. The cavity area 30 comprises the area wherein the electrons emitted by the cathode 24 interact with the anode 18 and a magnetic field surrounding the anode 18 to establish the frequency of the electromagnetic field generated at the anode 18, as described in greater detail below.

Disposed on either side of and coaxially with the anode ring 26 are a pair magnetic pole pieces 32 and 34. The magnetic pole pieces 32 and 34 act in conjunction with a permanent magnet assembly 36 so as to create a magnetic field about the anode 18 and the cathode 24. The interaction of the electrical field between the cathode 24 and the anode 18 and the magnetic field created by the magnetic assembly 36 and the pole pieces 32 and 34 occurs within the cavity 30 to establish an electromagnetic field at the anode 18.

The electromagnetic field at the anode 18 creates an alternating current in the anode 18 which passes along an antenna member 38. The alternating current induced in the anode 18 flows back and forth along the antenna 38 and changes at a specific radio frequency rate established by the cavity 30. This current generates electromagnetic waves from the antenna 38 which propagate outwardly through the radome structure 40.

Figure 3:
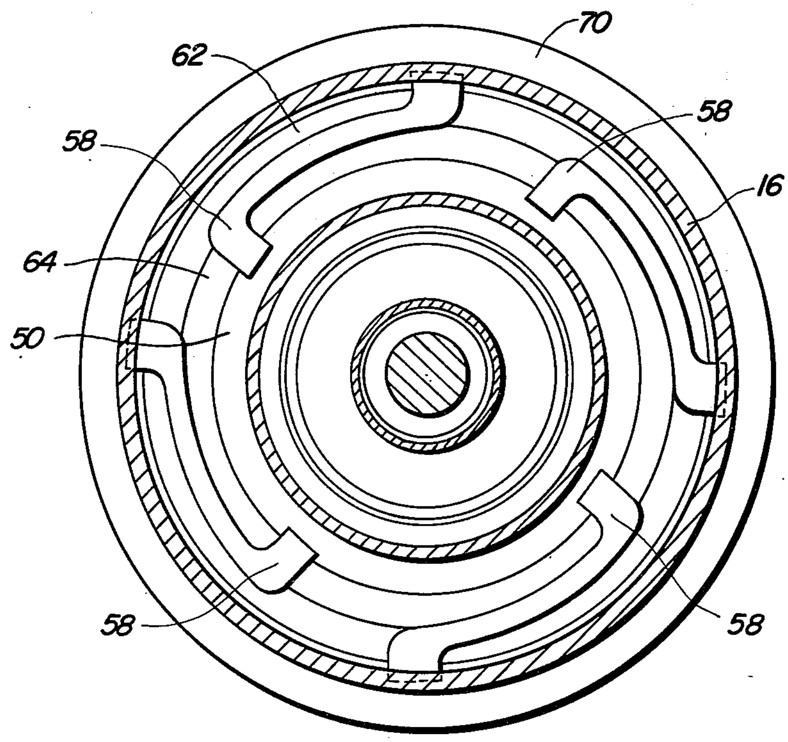
FIG. 3 is a cross-sectional view taken substantially along the line 3—3 of FIG. 1, illustrating the mounting mechanism of the present invention.
Figure 4:
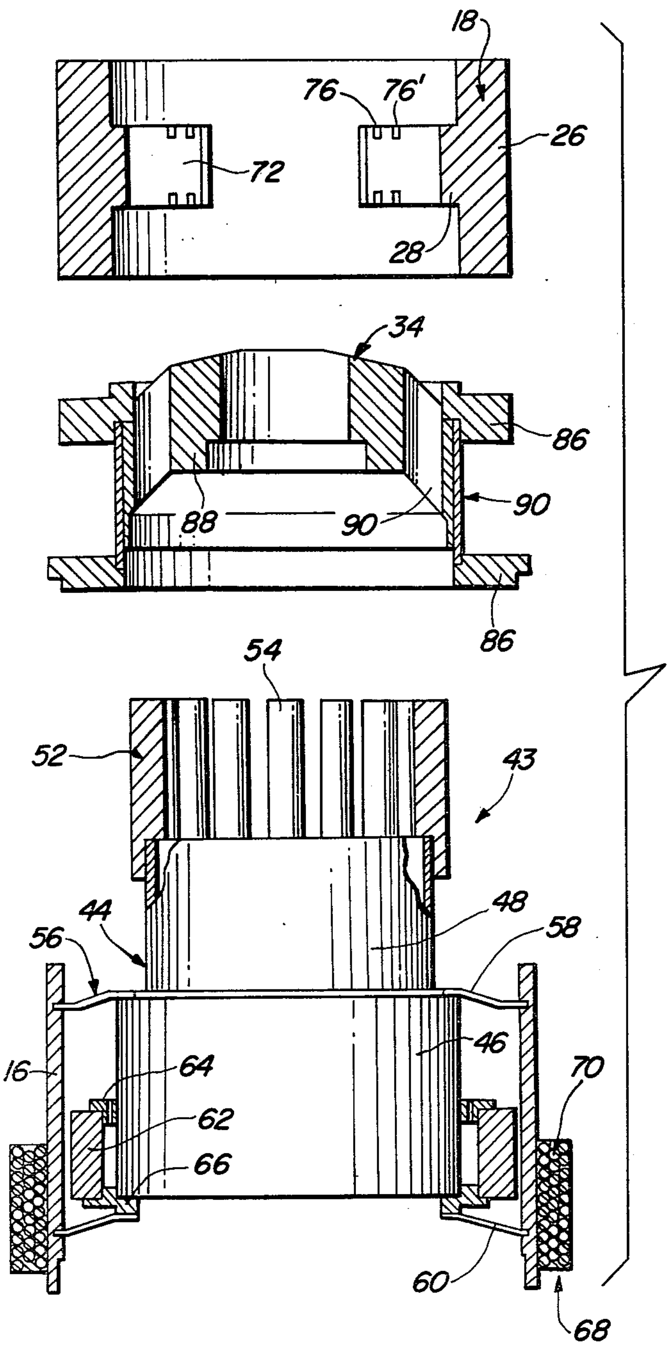
FIG. 4 is an exploded side elevation view, with some parts in section, of the tuning assembly of the present invention in relation to the anode structure of the magnetron tube shown in FIG. 1.
Figure 5:
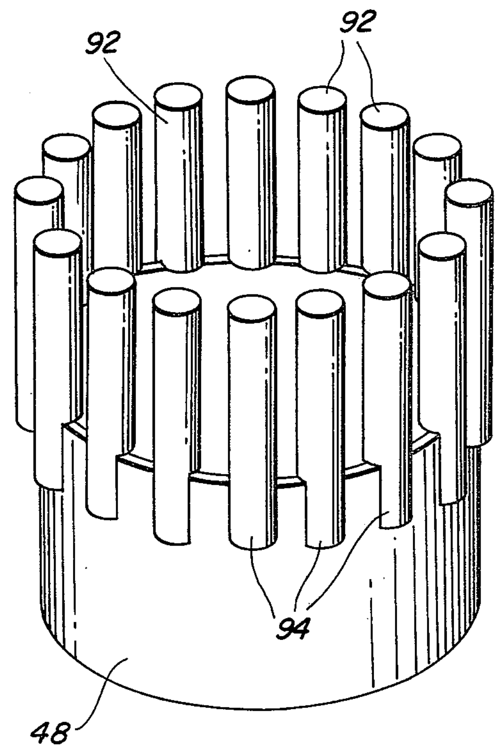
FIG. 5 is an enlarged front prospective view of the electrically conductive members and support member of one embodiment of the tuning assembly of the present invention.

Referring more particularly to FIGS. 1, 3 and 4, the magnetron tube 10 includes a tuning assembly 42 constructed in accordance with the present invention. The assembly 42 includes the outer hermetically sealed housing 16, which is preferably annular in shape, and a tuning mechanism 43. More particularly, a mounting assembly 44 is disposed coaxially within the housing 16. In preferred form, the mounting assembly 44 includes a tubular support member 46 suspended for linear reciprocating or oscillatory movement within the housing 16, and a tubular support element 48 which has a smaller diameter than the diameter of the support member 46 and is mounted on an annular flange 50 coaxially with and for linear movement with the support member 46.

An electrically conductive element 52 is mounted on the end of the tubular support element 48 and extends into the cavity 30 defined by the anode 18. In preferred form, the electrically conductive element 52 includes a plurality of electrically conductive members 54 circumferentially spaced about the end of the support element 48 and projecting into the cavity 30 as described in greater detail below. The electrically conductive element 52, the support element 48 and the support member 46 are all secured together to form the tuning mechanism 43 and move in unison in a linear oscillating manner.

A spring assembly 56 is provided for interconnecting the mounting assembly 44 to the housing 16. In preferred form, the spring assembly 56 includes a plurality of leaf springs 58 securely mounted at one end to the support member 46 adjacent the junction of the support element 48 and at the other end to the housing 16, and a plurality of leaf springs 60 securely mounted to the lower opposite end of the support member 46 and the housing 16. The ends of each spring 58, 60 are securely mounted so that the mounting assembly 44 is suspended within the housing 16. In the illustrated form, there are four leaf springs 58 and four leaf springs 60, each in the form of an elongated "s". The springs 58 are positioned equidistantly about the circumference of the support member 46, and the springs 60 are also disposed equidistantly about the circumference of the support member 46.

In the preferred form, the support member 46 and the support element 48 are constructed from non-magnetic material. To assist in exciting the oscillatory movement of the mounting assembly 44, the mounting assembly 44 further includes an annular magnetic member 62 secured about the support member 46 by a pair of annular brackets 64, 66. The magnetic member 62 is adapted to move in uniform linear movement with the mounting assembly 44.

The tuning mechanism 43, which includes the entire mounting assembly 44 and the electrically conductive element 52, is designed to move at a natural, preselected mechanical resonant frequency in a linear direction coaxial with the longitudinal axis thereof. The natural resonant frequency of the tuning mechanism 43 is dependent on the mass and spring rate of the mechanism 43. Therefore, the natural resonant frequency of the tuning mechanism 43 may be readily pre-selected by varying either the mass of the mechanism 43 and/or the spring rate of the spring assembly 56. The techniques for calculating the natural resonant frequency from the mass and spring rate are well known in the art and will therefore not be described herein. Once the mass of the tuning mechanism 43 and the spring rate of the spring mechanism 56 have been selected, however, the natural resonant frequency of the mechanism 43 may still be altered by inserting a spring coil 66 (FIG. 1) within the support member 46. The spring coil 66 abuts the inner surface of the flange 50 and the inner surface of the bottom portion of the housing 16. The spring rate of the coil spring 66 may be selectively varied so as to achieve the desired natural resonant frequency for the tuning mechanism 43.

To excite the tuner mechanism 43 at its natural resonant frequency, a power source 68 is provided about the exterior surface of the housing 16 and is magnetically coupled to the magnetic member 62. In preferred form, the power source 68 comprises an electromagnetic coil 70 wrapped around the housing 16. The coil 70 is adapted to be alternately energized and de-energized in a pulsating manner so that when the coil 70 is energized, the magnetic member 62 is attracted to move the tuning mechanism 43 in a first linear direction. After such a pulsing of the coil, the coil 70 returns to a de-energized state, and the spring mechanism 56 returns the tuning mechanism 43 to beyond its initial position, thereby moving the mechanism 43 in a second opposite linear direction. Therefore, the coil 70 is repeatedly pulsed at the same frequency rate as the natural resonant frequency of the tuning mechanism 43 so as to maintain the tuning mechanism 43 in a constant oscillating motion. This oscillating movement of the tuning mechanism 43 causes the electrically conductive element 52 to oscillate within the cavity 30. This mechanical oscillation of the electrically conductive element 52 within the cavity 30 changes the volume of the cavity 30 in an oscillatory manner, and as the volume of the cavity 30 is changed, the inductance of current from the electromagnetic field is changed in a similar oscillatory manner so as to vary the frequency of the electromagnetic field within the cavity 30 in such an oscillatory manner.

Figure 2:
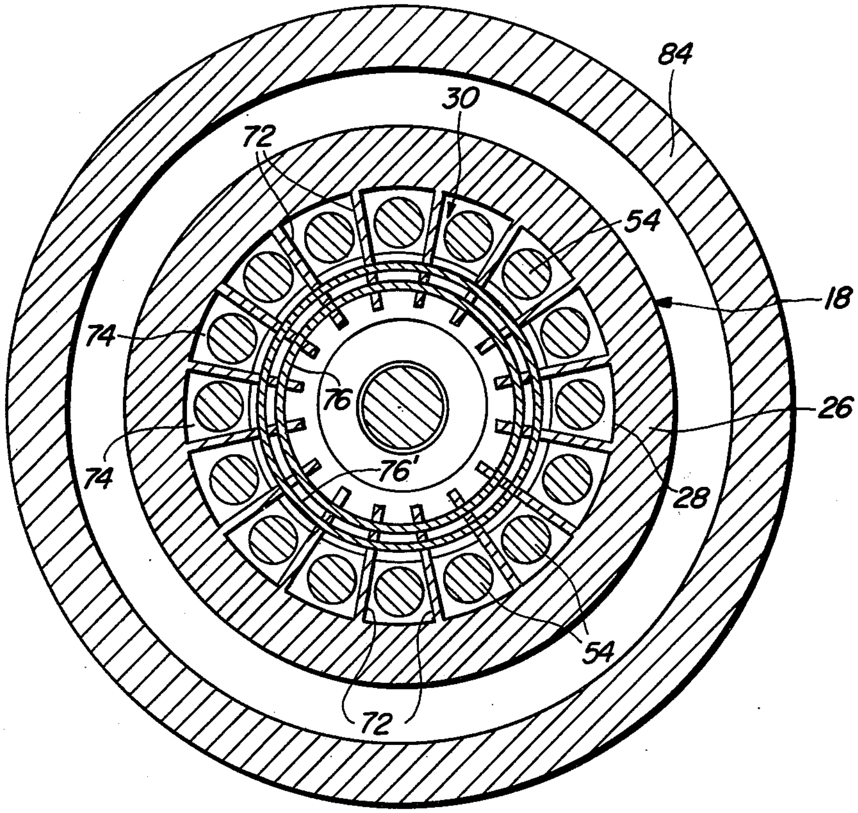
FIG. 2 is a cross-sectional view taken substantially along the line 2—2 of FIG. 1, illustrating the frequency defining cavity of the magnetron tube of FIG. 1.

Referring to FIGS. 1, 2 and 4, the annular assembly 18 includes the anode ring 26 and the rim member 28. In the preferred embodiment, the annular anode assembly 18 further includes a plurality of spaced tabs in the form of vanes 72 integrally formed with the rim 28 and extending radially inwardly toward the cathode 24. Each vane 72 is a flat electrically conductive member having a plane aligned with the central axis of the anode ring 26. The vanes 72 divide the cavity area 30 into a plurality of individual cavities or chambers 74 defined between the vanes 72. In addition, a plurality of electrically conductive strap members 76 are preferably provided in the form of annular rings which selectively interconnect a plurality of vanes 72. In preferred form, there are two strap members 76 and 76' which interconnect alternate vanes 72 so that one-half of the vanes 72 are electrically connected to one strap 76, and the other half of the vanes 72 are interconnected to the second strap 76'. The straps are utilized in conjunction with the vanes 72 and the ring 26 to define a particular frequency for the electromagnetic field created within the cavity area 30. Use of such straps 76, 76', and the technique for calculating the appropriate dimensions and arrangements of the vanes 72, the straps 76, 76', and the ring 26, to establish a specific frequency, are well known in the art and are therefore not disclosed specifically herein.

When the anode assembly 18 is constructed in the above described preferred form, the electrically conductive element 52 is preferably in the form of a plurality of electrically conductive members 54. The members 54 are mounted circumferentially about the end of the support element 48 and are appropriately spaced so that each member 54 is adapted for positioning within one cavity 74. The end portion of each member 54 is positioned so that it remains within a cavity 74 as the tuning mechanism 43 is oscillated. As the tuning mechanism 43 oscillates the electrically conductive member 54 also oscillates within a cavity 74, thereby changing the volume of each cavity 74 in a uniform oscillating manner. Thus, the entire volume of the cavity area 30 is changed in a uniform oscillating manner. This change in the volume of each cavity 74 by the presence of an electrically conductive member therein alters the inductance of current by the annular ring 26 and changes the frequency of the electromagnetic field present within the cavity area 30. This change in the electromagnetic field is proportional to the change of the volume of the cavity area 30, so that the frequency of the electromagnetic field oscillates in a proportional manner with the oscillation of the tuning mechanism 43. As the frequency of the electromagnetic field within the cavity area 30 oscillates, the output frequency of the magnetron tube 10 similarly oscillates about the pre-selected frequency.

Referring to FIGS. 1 and 4, the magnetic pole pieces 32 and 34 are preferably comprised of a soft magnetic material, such as iron, which is not permanently magnetized. The magnetic pole pieces 32 and 34 direct the magnetic field from the permanent magnetic assembly 36 into the interaction space between the cathode assembly 24 and the anode assembly 18. The permanent magnetic assembly 36 may comprise any known arrangement. In the illustrated embodiment, the assembly 36 includes two permanent magnets 78 and 80 interconnected by steel tubes 82, 82', and a sleeve member 84. Thus, the strength of the magnetic field may be selectively varied depending upon the strength of the permanent magnets 78, 80.

The magnetic pole piece 34 includes an annular bracket assembly 86, which functions to mount the permanent magnet 80 as well as to form the housing 20, and a magnetic pole piece member 88. The magnetic pole piece member 88 includes a plurality of orifices or channels 90 which are coaxially aligned with the longituninal axis of the electrically conductive members 54 and the anode ring 26. The channels 90 function as passageways for the electrically conductive members 54 between the support element 48 and the cavities 74.

Referring more specifically to FIGS. 4, 5, 6 and 9, one preferred embodiment of the electrically conductive members 54 is illustrated therein. In this embodiment, each electrically conductive member 54 comprises a pin member 92 constructed from any suitable electrically conductive material. The pin 92 has a substantially uniform diameter along its length, and includes a base portion 94 which is notched to form a ledge for mounting the pin 92 to the support element 48. The diameter of the pin 92 is selected so that the pin 92 freely passes through a channel 90 and is positioned between a pair of vanes 72 without making contact therewith.

When the electrically conductive member 54 is in the form of the pin 92, however, there is a tendency for secondary resonant effects to be introduced into the magnetic pole piece 34 due to the oscillation of the electrically conductive pin 92 within the channel 90. When it is desired to avoid such secondary resonant effects, a second preferred embodiment of the invention may be utilized.

Figure 7:
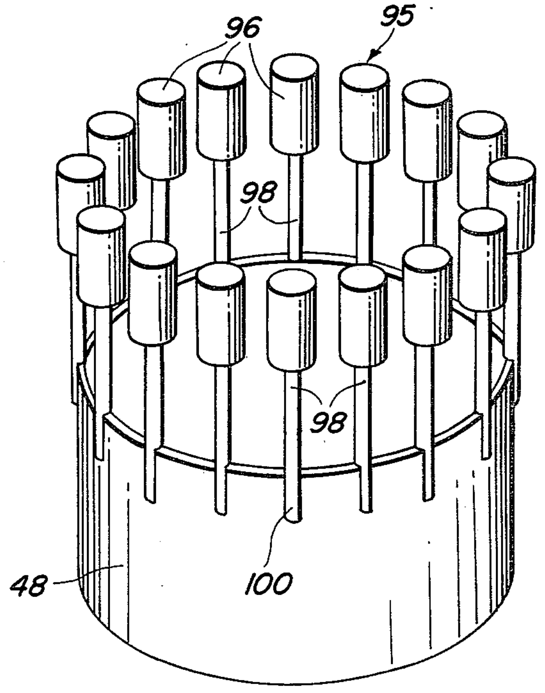
FIG. 7 is an enlarged front prospective view of the mounting members and support member of a second embodiment of the tuning assembly constructed in accordance with the present invention.
Figure 6:
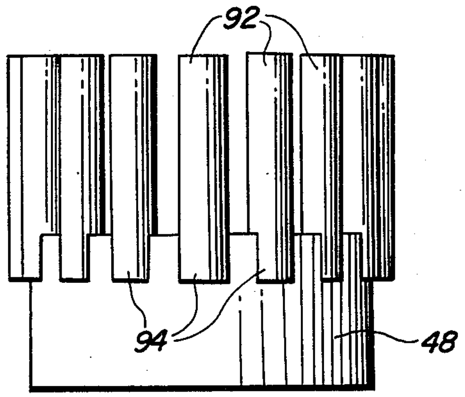
FIG. 6 is a side elevation view of the embodiment illustrated in FIG. 5.
Figure 8:
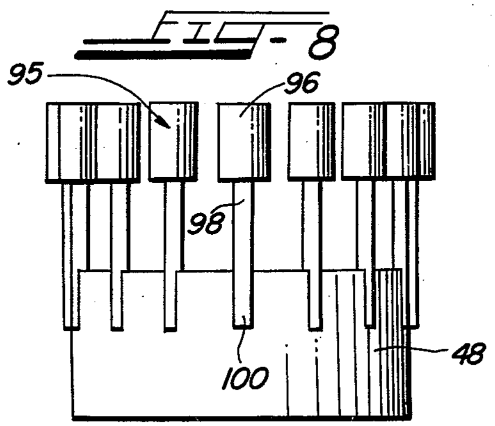
FIG. 8 is a side elevation view of the embodiment illustrated in FIG. 7.
Figure 9:
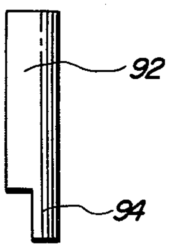
FIG. 9 is a side elevation view of one electrically conductive member of the embodiment illustrated in FIGS. 5 and 6.
Figure 10:
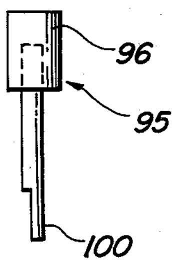
FIG. 10 is a side elevation view of one electrically conductive member of the embodiment illustrated in FIGS. 7 and 8.

Referring to FIGS. 7, 8 and 10, wherein the second embodiment of the electrically conductive member 54 is illustrated, the member 54 is in the form of an elongated member 95 having an expanded diameter end portion 96 for positioning within a cavity 74. The end portion 96 is constructed from electrically conductive material and is of sufficient diameter to substantially fill the cavity 74 in cross-sectional dimention, as illustrated in FIG. 2. The elongated member 95 also includes a shaft portion 98 which interconnects the end portion 96 to the support element 48, and the diameter of the shaft portion 98 is substantially less than the diameter of the end portion 96. The shaft portion 98 is sized so that the shaft portion 98 remains within the channel 90 as the tuning mechanism 43 oscillates. In this manner, the amount of material within the channel 90 is substantially reduced, which in turn substantially reduces the secondary resonant effects. Furthermore, the shaft portion 98 may also be constructed from an electrically non-conductive material such as a ceramic material. In this manner, the secondary resonant effects in the magnetic pole piece 34 are almost non-existant. The shaft 98 preferably includes a base portion 100 which is notched to form a ledge for attachment to the support element 48.

Referring now to FIG. 1, the cathode structure 24 is preferably in the form of a helical, springlike member 102 positioned between two end plates 104, 106. The helical member 102 is preferably constructed from tungsten impregnated by electron emissive material, as known in the art. This particular cathode structure is directly heated by a current from conducters 108, which direct heating causes electron emission by the cathode 24, and permits rapid warm-up.

The tuning assembly 42 as described above provides a constantly variable frequency across a specific frequency band, generally varying 5% on either side of a center frequency. For example, the tuning mechanism 42 as disclosed in the magnetron 10 of FIG. 1 can provide a 100–300 MHz frequency variation around any selected center frequency, the selected center frequency being established by the dimensions of the anode assembly and the cavity defining elements. Such a center frequency can be established at any desired frequency, for example, between 1-50 gigahertz, by utilizing known techniques in the art. To achieve such a frequency variation, the natural resonant frequency of the tuning mechanism 43 may be generally set at approximately 15-20 cycles per second. However, as previously described, the natural resonant frequency of the tuning mechanism 43 may be established at any selected level, thereby permitting any desired frequency variation to occur in the electromagnetic field at the anode 18.

As can be seen from the above, the present invention provides a novel mechanism whereby the frequency of an electromagnetic field within a hermetically sealed device may be readily varied in an oscillatory manner. This oscillatory variation of the frequency is achieved by a mechanically oscillating device which has all moving mechanical components disposed within a rigid housing. Therefore, there are no thin walled or flexible portions required in the hermetically sealed housing, which design prevents atmospheric leakage and provides a long storage or shelf life. Furthermore, in the example wherein the tuning assembly of the invention is used in a magnetron or other vacuum tube, all the mechanical parts perform within a vacuum, thereby obviating the dampening effect of any atmospheric environment. Finally, the tuning assembly of the present invention is based on a natural resonant frequency of the tuning mechanism. To oscillate this mechanism in a desired manner, only a small amount of energy in a pulsed form is required, inasmuch as the power source for moving the tuning assembly is magnetically coupled to the tuning mechanism.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein but may be modified within the scope of the appended claims.

I claim:

1. A tuning assembly for selectively oscillating the frequency of an electromagnetic field within a hermetically sealed device, said device having a rigid, hermetically sealed housing, means for generating said electromagnetic field; therewithin, and means for defining a cavity within said housing for establishing the frequency of said electromagnetic field, said tuning assembly comprising:

electrically conductive means mounted for linear movement within said cavity to selectively vary the volume of said cavity to oscillate said established frequency;

mounting means disposed within said rigid housing comprising a support member for securely mounting said electrically conductive means within said housing, and flat, leaf spring means for connecting said support member to said housing and adapted to permit linear oscillatory movement of said support member to said housing and adapted to permit linear oscillatory movement of said support member within said housing, said pre-selected mechanical resonant frequency being determined by the mass of said electrically conductive means and said mounting means and the spring rate of said leaf-spring means; and power means disposed exterior to said rigid housing and magnetically coupled to said mounting means for exciting said mounting means.

2. The tuning assembly as described in claim 1, wherein said mounting means further includes a magnetic member secured to said support member for linear movement therewithin, and wherein said power means comprises an electromagnetic coil disposed about the exterior of said housing and magnetically coupled to said magnetic member, whereby pulsing of said coil moves said support member in one linear direction and said spring means moves said support member in a second opposite direction.

3. The tuning assembly as described in claim 2, wherein said mounting means further includes coil spring means disposed within said support member and having a predetermined spring rate to selectively vary the spring rate of said mounting means, thereby permitting selective variation of the mechanical resonant frequency of said mounting means.

4. The tuning assembly as described in claim 1, wherein said hermetically sealed device further includes an annular anode assembly, and said cavity defining means comprises an annular body forming a portion of said anode and a plurality of spaced tabs in form of vanes projecting radially inwardly from said annular body to define a plurality of chambers therebetween, and wherein said electrically conductive means comprises a plurality of electrically conductive members secured for movement with said mounting means, each said electrically conductive member being disposed for uniform linear movement within one said chamber in an oscillatory manner to vary the volumes of said chambers a pre-determined amount to selectively vary the frequency of said electromagnetic field.

* * * * *